US005478774A

United States Patent [19]
Ackley et al.

[11] Patent Number: 5,478,774
[45] Date of Patent: Dec. 26, 1995

[54] METHOD OF FABRICATING PATTERNED-MIRROR VCSELS USING SELECTIVE GROWTH

[75] Inventors: Donald E. Ackley, Lambertville, N.J.; Piotr Grodzinski, Chandler; Michael S. Lebby, Apache Junction, both of Ariz.; Hsing-Chung Lee, Calabasas, Calif.; Chan-Long Shieh, Paradise Valley, Ariz.

[73] Assignee: Motorola, Schaumburg, Ill.

[21] Appl. No.: 261,276

[22] Filed: Jun. 15, 1994

[51] Int. Cl.⁶ .................................. H01L 21/20
[52] U.S. Cl. ................................................ 437/129
[58] Field of Search ................... 437/24, 128, 129, 437/228; 372/45

[56] References Cited

U.S. PATENT DOCUMENTS

| | | | |
|---|---|---|---|
| 5,034,344 | 7/1991 | Jewell et al. | 437/129 |
| 5,208,183 | 5/1993 | Chen et al. | 437/129 |
| 5,256,596 | 10/1993 | Ackley et al. | 437/129 |
| 5,258,316 | 11/1993 | Ackley et al. | 437/24 |
| 5,293,392 | 3/1994 | Shieh et al. | 437/129 |
| 5,317,587 | 5/1994 | Ackley et al. | 437/129 |
| 5,328,854 | 7/1994 | Vakshoori et al. | 437/128 |

*Primary Examiner*—R. Bruce Breneman
*Attorney, Agent, or Firm*—Eugene A. Parsons

[57] ABSTRACT

A method of fabricating VCSELs including the steps of epitaxially growing a first mirror stack of a first conductivity type, an active region on the first mirror stack, and a first portion of a second mirror stack of a second conductivity type on the active region. A dielectric layer is then formed on the first portion of the second mirror stack, patterned to define an operating region and a remaining portion of the second mirror stack is epitaxially grown on the first portion to form a complete second mirror stack. Portions of the second mirror stack overlying the dielectric layer are polycrystalline in formation and substantially limit the remaining portion of the second mirror stack to the operating region. The polycrystalline layers can then be removed and electrical contacts formed.

16 Claims, 2 Drawing Sheets

METHOD OF FABRICATING PATTERNED-MIRROR VCSELS USING SELECTIVE GROWTH

FIELD OF THE INVENTION

The present invention pertains to patterned-mirror vertical cavity surface emitting lasers (VCSELs) and more specifically to an improved method of fabrication of patterned-mirror VCSELs wherein complicated etching is not required.

BACKGROUND OF THE INVENTION

In general, when fabricating patterned-mirror, or ridge-guide, VCSELs, a first mirror stack is epitaxially deposited on the surface of a substrate, followed by an active region and then a second mirror stack. The second, or upper, mirror stack is etched to form a mesa (ridge) which essentially defines a waveguide in which the lasing occurs. The major problem in this fabrication scheme is that etching the second mirror stack is a very complicated and critical step. Much care must be used not to inadvertently etch into the active region and, thereby, reduce the reliability of the device. In many fabrication processes this etch step is controlled only by timing and careful control of the etch rate. Also, this process causes difficulties with control of the patterned mirror height and uniformity across the wafer (generally thousands of VCSELs are formed on a single wafer).

In a U.S. Pat. No. 5,293,392, entitled "Top Emitting VCSEL with Etch Stop Layer", issued Mar. 8, 1994 an etch stop layer is grown in the second, or upper, mirror stack and utilized to automatically stop the etch at a desired level. While the etch stop method utilizes the excellent control achieved in MOVPE growth to define the patterned mirror height, the growth of a layer of dissimilar material (the etch stop layer) is required which can significantly complicate the fabrication process.

Accordingly, it is desirable to provide a fabrication method which solves the above described problems.

It is a purpose of the present invention to provide a new and improved method of fabricating patterned-mirror VCSELs.

It is another purpose of the present invention to provide a new and improved method of fabricating patterned-mirror VCSELs wherein complicated etching steps are not required.

It is still another purpose of the present invention to provide a new and improved method of fabricating patterned-mirror VCSELs utilizing selective growth techniques.

SUMMARY OF THE INVENTION

The above problems and others have been at least partially solved and the above purposes and others are realized through a method of fabricating VCSELs including the step of forming a first mirror stack of a first conductivity type on a substrate, an active region on the first mirror stack, and a first portion of a second mirror stack of a second conductivity type on the active region. Another step includes patterning a dielectric layer on the first portion of the second mirror stack to define an operating region wherein a surface of the first portion of the second mirror stack is exposed and forming a remaining portion of the second mirror stack of the second conductivity type on the exposed surface of the first portion of the second mirror stack in the operating region. Electrical contacts are then formed on the remaining portion of the second mirror stack and on the substrate.

A semiconductor layer of the second conductivity type can be formed on the substrate, prior to the formation of the first mirror stack, and patterned to expose a surface of the substrate in the operating region. The p-n junction produced between the semiconductor layer and the first mirror stack limits operating current to only the operating region.

BRIEF DESCRIPTION OF THE DRAWINGS

Referring to the drawings.

DESCRIPTION OF THE PREFERRED EMBODIMENTS

Figure 1:
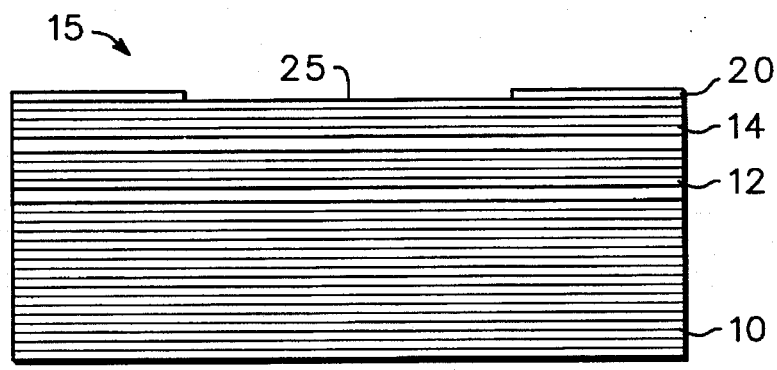
FIGS. 1 through 3 illustrate simplified sectional views of several structures realized in various different steps of a fabrication method in accordance with the present invention.
Figure 2:
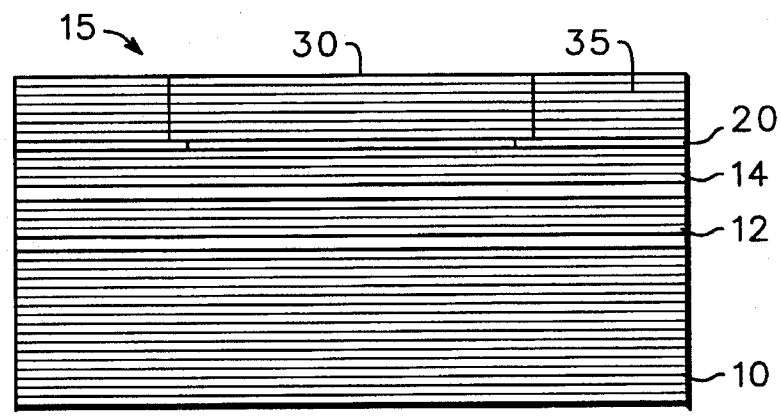
Figure 3:
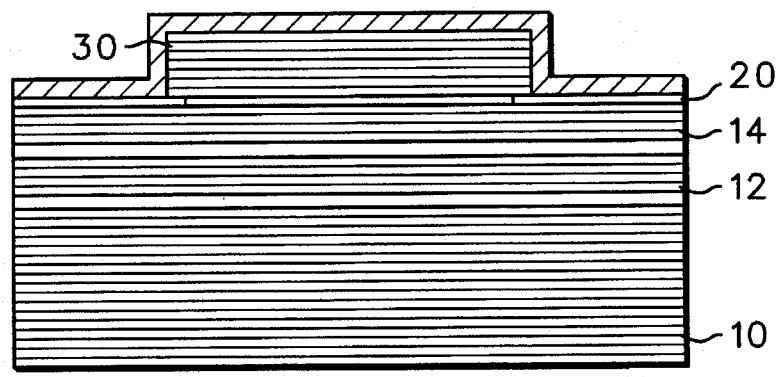

Referring to FIGS. 1 through 3, simplified sectional views of several structures realized in various different steps of a fabrication method in accordance with the present invention are illustrated. In particular, FIG. 1 illustrates a first mirror stack 10 having an active region 12 formed thereon. Mirror stack 10 is generally formed, for example, by epitaxially growing a plurality of layers of semiconductor material with alternating indexes of refraction. Some examples of materials that can be used for this purpose are: alternating layers of $Al_{0.15}Ga_{0.85}As$ and $Al_{0.80}Ga_{0.20}As$; alternating layers of GaAs and $Al_{0.80}Ga_{0.20}As$; etc. Each pair of alternating layers are grown to a thickness of one quarter of the emission wavelength, propagating in the layers, and the number of pairs is chosen to provide as much reflectivity of light as possible while limiting the stack to a practical number.

Active region 12 generally includes one or more quantum wells separated by barrier layers with a spacer or cladding layer on either side thereof. The quantum wells and spacer layers are also grown epitaxially.

A portion 14 of a second mirror stack 15 is formed on the upper surface of active region 12 by, for example, epitaxially growing pairs of semiconductor layers as described in conjunction with mirror stack 10. Generally, the pairs of layers will be formed of materials similar to those of mirror stack 10 and the thicknesses will be similar to provide the proper reflectivity of a selected wavelength or spectrum of wavelengths. Also, the first and second mirror stacks are doped with opposite conductivity types to form a two terminal (diode) structure for the flow of electrical current therethrough. In this specific embodiment, for example, mirror stack 10 is doped for n-type conductivity and mirror stack 15 is doped for p-type conductivity. The thickness of portion 14 of mirror stack 15 is determined by the number of pairs of layers that are grown and it is desirable to end portion 14 on a GaAs or low Al composition layer to achieve a high quality second growth, as will be understood presently.

The quantum wells of active region 12 produce photons (light) in accordance with a well known phenomenon when properly energized by electrical current applied thereacross. In general, the greater the current applied to active region 12 the greater the number of photons generated. The photons are reflected by mirror stacks 10 and 15 and produce the well known lasing effect that ultimately produces the emitted light. The wavelength of the light is determined by the materials utilized in the quantum well or wells in active region 12.

A dielectric layer 20 is formed on the upper surface of portion 14 of mirror stack 15. Dielectric layer 20 is patterned on portion 14 to define an operating region 25, generally in a central area of layer 20, wherein a surface of portion 14 of mirror stack 15 is exposed. Layer 20 can be patterned by applying photoresist and selectively growing an oxide, nitride, or the like, or by growing a blanket layer of dielectric material and selectively etching with the use of photoresist or other convenient masking material. It will of course be understood that a large plurality of VCSELs are generally formed in a wafer and that the selective growth or etching is utilized to form or define a circular operating region for each of these VCSELs. Also, the thickness of layer 20 is not critical as long as it is thick enough to substantially prevent the flow of electrical current therethrough, as will be explained presently.

Referring specifically to FIG. 2, once dielectric layer 20 is patterned to define operating region 25 with the correct diameter, a second portion 30 pairs of semiconductor layers is formed to complete mirror stack 15. In this specific embodiment this is accomplished by placing the structure of FIG. 1 back in an epitaxial reactor and growing the additional pairs of mirror layers. Depending upon the growth conditions and the materials system, either there will be no deposition on the upper surface of dielectric layer 20 or polycrystalline material 35 will be deposited, as illustrated in FIG. 2.

Also, there will be some lateral growth over dielectric layer 20 due to the fact that the layers are fairly thick. This lateral growth is easily compensated for in the device design and indeed has the beneficial effect of making the lateral size of mirror stack 15 larger than the opening through dielectric layer 20 which will confine the operating current to a central portion of the operating region, thus achieving a better match between the optical mode size and the current distribution.

In the embodiment where no, or substantially no, deposition occurs on dielectric layer 20, the processing of the VCSEL (or wafer) can be completed by simply applying p- and n-metallizations and an isolation etch. In the embodiment where polycrystalline material 35 has been deposited, it can either be left to form a planar structure or, as illustrated in FIG. 3 etched off using dry etch chemistries which do not attack the single crystal material of mirror stack 15. Again the device processing is completed by applying p- and n-metallizations and an isolation etch to separate individual VCSELs in a wafer.

Figure 4:
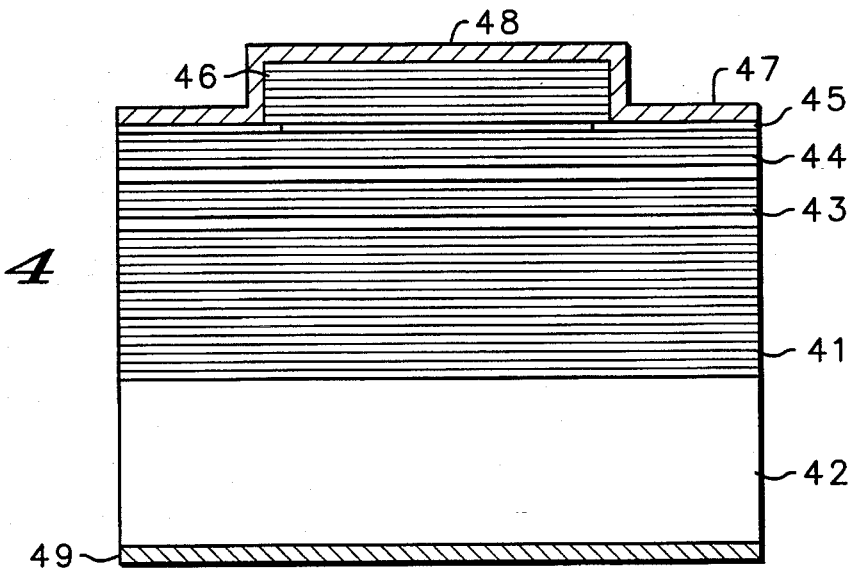
FIGS. 4 through 6 illustrate three different embodiments of VCSELs fabricated in accordance with the present invention.

Referring specifically to FIG. 4, an individual VCSEL 40 is illustrated wherein a first mirror stack 41 is grown on the upper surface of a substrate 42, an active region 43 is grown on the upper surface of mirror stack 41 and a first portion 44 of a second mirror stack is grown on active region 43. A dielectric layer 45 is patterned on the upper surface of portion 44 so as to define an operating region in a central portion thereof and a remaining portion 46 of the second mirror stack is grown on an exposed surface of portion 44.

A p-type metallization 47/48 is formed on the surface of the upper mirror stack by any known method. Because VCSEL 40 emits light through the upper surface of the mesa defined by remaining portion 46 of the second mirror stack, at least portion 48 of the metallization overlying the upper surface of the mesa may be a transparent metal, such as indium-tin-oxide (ITO) or the like. It should be noted that portion 47 of the metallization overlies dielectric layer 45 and, therefore, does not electrically contact the upper mirror stack, so that operating current is limited to the central operating region. An n-type metallization 49 is formed on the lower surface of substrate 42 to provide another electrical contact for VCSEL 40.

In another embodiment, the quantum wells of active region 12 can be formed so as to cause lasing at a wavelength that passes through the substrate, rather than emitting through the top (as in FIG. 3). This can be accomplished, for example, by forming the quantum wells of InGaAs with GaAs barrier layers therebetween.

Figure 5:
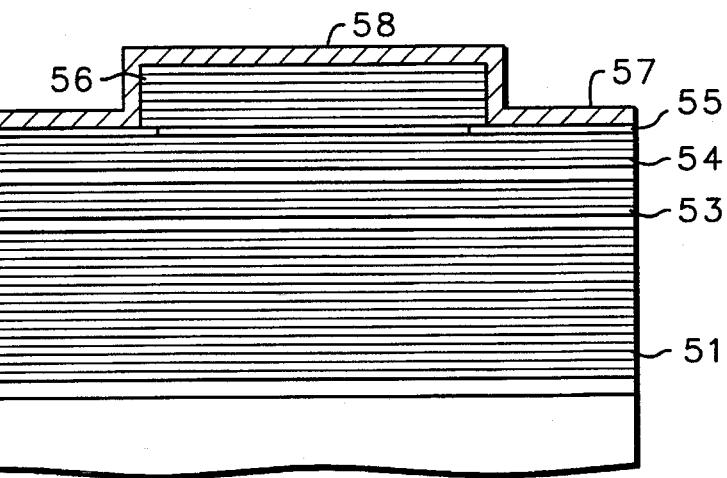

Referring specifically to FIG. 5, another embodiment of an individual VCSEL 50 is illustrated wherein a heavily doped layer 59a is formed on the upper surface of a substrate 52, a first mirror stack 51 is grown on layer 59a, an active region 53 is grown on the upper surface of mirror stack 51 and a first portion 54 of a second mirror stack is grown on active region 53. A dielectric layer 55 is patterned on the upper surface of portion 54 so as to define an operating region in a central portion thereof and a remaining portion 56 of the second mirror stack is grown on an exposed surface of portion 54.

Again in this embodiment a p-type metallization 57/58 is formed on the surface of the upper mirror stack by any known method. At least portion 58 of the p-type metallization overlying the upper surface of the mesa may be a transparent metal, such as ITO or the like and portion 57 of the p-type metallization overlies dielectric layer 55 so that operating current is limited to the central operating region. An n-type metallization 59 is formed on layer 59a on the upper surface of substrate 52 to provide another electrical contact for VCSEL 50. Layer 59a of heavily doped semiconductor material is provided on the surface of substrate 52 to provide a better, low resistance contact to VCSEL 50. In this embodiment, electrical contact 59 is formed on the same surface of substrate 52 as the surface on which mirror stack 51 is formed to make mounting of VCSEL 50 more convenient and electrical contacts 58 and 59 more accessible.

Figure 6:
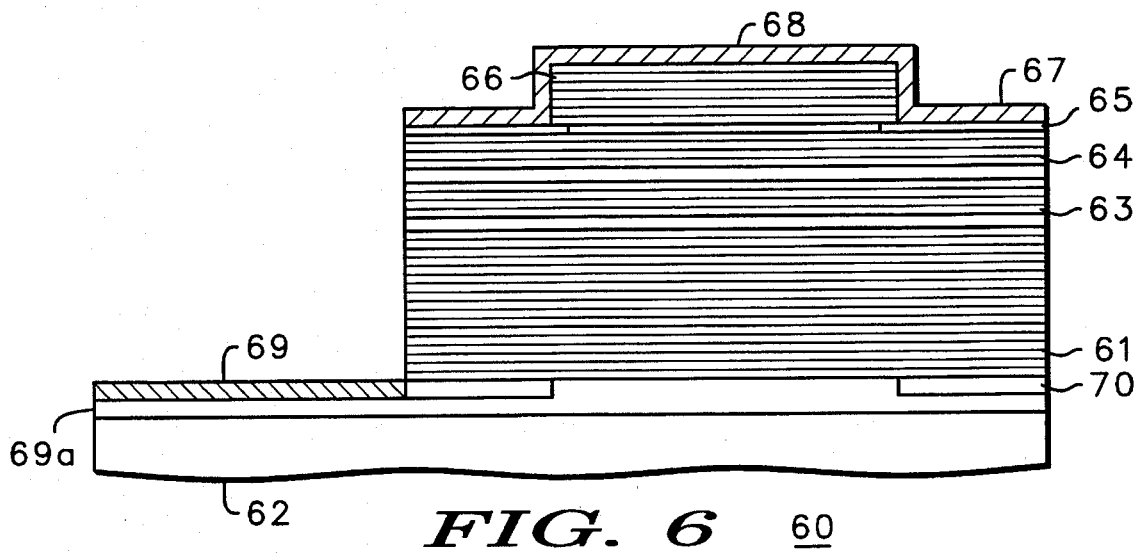

Referring specifically to FIG. 6, another embodiment of an individual VCSEL 60 is illustrated wherein a heavily doped layer 69a is formed on the surface of a substrate 62. A doped semiconductive layer 70 is patterned on the upper surface of layer 69a to form a mesa shaped operating region in which the surface of layer 69a (or substrate 62) is exposed. Layers 69a and 70 cooperate to provide a planar upper surface. First mirror stack 61 is grown on the planar upper surface, an active region 63 is grown on the upper surface of mirror stack 61 and a first portion 64 of a second mirror stack is grown on active region 63. A dielectric layer 65 is patterned on the upper surface of portion 64 so as to define an operating region in a central portion thereof and a remaining portion 66 of the second mirror stack is grown on an exposed surface of portion 64.

In this specific embodiment, mirror stack 61 is doped for n-type conduction and portions 64 and 66 of the second mirror stack are doped for p-type conduction. Also, layer 70 is doped for p-type conduction and, in conjunction with mirror stack 61, forms a p-n junction which blocks current flow therethrough. Thus, current flow in portions 64 and 66 of the second mirror stack is limited by dielectric layer 65 to only the central portion of the operating region and current flow in mirror layer 61 is limited by the p-n junction formed by layer 69a to only the central portion of the operating region.

Again in this embodiment a p-type metallization 67/68 is formed on the surface of the upper mirror stack by any known method. At least portion 68 of the p-type metallization overlying the upper surface of the mesa may be a transparent metal, such as ITO or the like and portion 67 of the p-type metallization overlies dielectric layer 65 so that operating current is limited to the central operating region. An n-type metallization 69 is formed on the upper surface of layer 69a to provide another electrical contact for VCSEL 60. In this embodiment, electrical contact 69 is formed on the same surface of layer 69a as the surface on which mirror stack 61 is formed to make mounting of VCSEL 60 more convenient and electrical contacts 68 and 69 more accessible.

Thus, new and improved methods of fabricating patterned-mirror VCSELs are disclosed wherein complicated etching steps are not required. By utilizing novel selective growth techniques the problems encountered in etching mesas, or ridges, are eliminated while maintaining the advantages of the patterned-mirror VCSEL. Also, the dielectric layer utilized for selective growth forms a current barrier which restricts current flow to the operating region, or central portion thereof. Because the height of the mesa, or ridge, in the upper mirror stack is determined by the size (number of pairs of layers) of the first portion grown, the first portion of the second mirror stack can be anything from zero pairs to the full number of pairs in the second mirror stack. Further, in a specific embodiment a p-n junction is formed in the lower mirror stack to further limit current to only the operating region, or central portion thereof.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating patterned-mirrors for VCSELs comprising the steps of:

forming a first mirror stack of a first conductivity type;

forming an active region on the first mirror stack;

forming a first portion of a second mirror stack of a second conductivity type on the active region;

patterning a dielectric layer on the first portion of the second mirror stack to define an operating region wherein a surface of the first portion of the second mirror stack is exposed; and forming a remaining portion of the second mirror stack of the second conductivity type on the exposed surface of the first portion of the second mirror stack in the operating region.

2. A method of fabricating patterned-mirrors for VCSELs as claimed in claim 1 wherein the step of forming a remaining portion of the second mirror stack of the second conductivity type results in forming a portion of the remaining portion of the second mirror stack on the dielectric layer and the method includes in addition the step of removing at least a portion of the remaining portion of the second mirror stack overlying the dielectric layer.

3. A method of fabricating patterned-mirrors for VCSELs as claimed in claim 1 wherein the step of forming a first mirror stack of a first conductivity type includes forming a first mirror stack of n-type conductivity.

4. A method of fabricating patterned-mirrors for VCSELs as claimed in claim 3 wherein the steps of forming a first and remaining portions of a second mirror stack of a second conductivity type includes forming a second mirror stack of p-type conductivity.

5. A method of fabricating patterned-mirrors for VCSELs as claimed in claim 1 wherein the step of patterning a dielectric layer includes forming an oxide layer and removing portions of the oxide layer by etching.

6. A method of fabricating patterned-mirrors for VCSELs as claimed in claim 1 wherein the step of patterning a dielectric layer includes selectively growing an oxide layer.

7. A method of fabricating VCSELs comprising the steps of:

providing a substrate having a surface;

forming a first mirror stack of a first conductivity type on the surface of the substrate;

forming an active region on the first mirror stack;

forming a first portion of a second mirror stack of a second conductivity type on the active region;

patterning a dielectric layer on the first portion of the second mirror stack to define an operating region wherein a surface of the first portion of the second mirror stack is exposed;

forming a remaining portion of the second mirror stack of the second conductivity type on the exposed surface of the first portion of the second mirror stack in the operating region;

providing a first electrical contact on the substrate; and providing a second electrical contact on the remaining portion of the second mirror stack.

8. A method of fabricating VCSELs as claimed in claim 7 wherein the step of forming a first mirror stack further includes forming a layer of semiconductor material having the second conductivity type on the surface of the substrate and patterning the layer of semiconductor material to define the operating region and an exposed portion of the surface of the substrate in a substantially central portion of the layer of semiconductor material, the first mirror stack being formed on the exposed portion of the surface of the substrate and the layer of semiconductor material.

9. A method of fabricating VCSELs as claimed in claim 8 wherein the step of providing a first electrical contact on the substrate includes providing the first electrical contact on the same surface of the substrate as the surface on which the layer of semiconductor material is formed.

10. A method of fabricating patterned-mirrors for VCSELs comprising the steps of:

epitaxially growing a first mirror stack of a first conductivity type;

epitaxially growing an active region on the first mirror stack;

epitaxially growing a first portion of a second mirror stack of a second conductivity type on the active region;

forming a dielectric layer on the first portion of the second mirror stack patterned to define an operating region wherein a surface of the first portion of the second mirror stack is exposed; and epitaxially growing a remaining portion of the second mirror stack of the second conductivity type on the exposed surface of the first portion of the second mirror stack in the operating region to form a complete second mirror stack, portions of the second mirror stack overlying the dielectric layer being polycrystalline in formation and substantially limiting the remaining portion of the second mirror stack to the operating region.

11. A method of fabricating patterned-mirrors for VCSELs as claimed in claim 10 including in addition the step of removing a portion of the polycrystalline formation overlying the dielectric layer.

12. A method of fabricating patterned-mirrors for VCSELs as claimed in claim 10 wherein the step of epitaxially growing a first mirror stack of a first conductivity type includes epitaxially growing a first mirror stack of n-type conductivity.

13. A method of fabricating patterned-mirrors for VCSELs as claimed in claim 12 wherein the steps of epitaxially growing a first and remaining portions of a second mirror stack of a second conductivity type includes epitaxially growing a second mirror stack of p-type conductivity.

14. A method of fabricating VCSELs comprising the steps of:

providing a substrate having a surface;

epitaxially growing a first mirror stack of a first conductivity type on the surface of the substrate;

epitaxially growing an active region on the first mirror stack;

epitaxially growing a first portion of a second mirror stack of a second conductivity type on the active region;

forming a dielectric layer on the first portion of the second mirror stack patterned to define an operating region wherein a surface of the first portion of the second mirror stack is exposed;

epitaxially growing a remaining portion of the second mirror stack on the exposed surface of the first portion to form a complete second mirror stack, portions of the second mirror stack overlying the dielectric layer being polycrystalline in formation and substantially limiting the remaining portion of the second mirror stack to the operating region;

providing a first electrical contact on the substrate; and providing a second electrical contact on the remaining portion of the second mirror stack.

15. A method of fabricating VCSELs as claimed in claim 14 wherein the step of epitaxially growing a first mirror stack further includes forming a layer of semiconductor material having the second conductivity type on the surface of the substrate and patterning the layer of semiconductor material to define the operating region and an exposed portion of the surface of the substrate in a substantially central portion of the layer of semiconductor material, the first mirror stack being epitaxially grown on the exposed portion of the surface of the substrate and the layer of semiconductor material.

16. A method of fabricating VCSELs as claimed in claim 15 wherein the step of providing a first electrical contact on the substrate includes providing the first electrical contact on the same surface of the substrate as the surface on which the layer of semiconductor material is formed.

* * * * *